United States Patent
Singh

(10) Patent No.: US 10,685,900 B2
(45) Date of Patent: Jun. 16, 2020

(54) PACKAGING OF A SEMICONDUCTOR DEVICE WITH PHASE-CHANGE MATERIAL FOR THERMAL PERFORMANCE

(71) Applicant: Deere & Company, Moline, IL (US)

(72) Inventor: Brij N. Singh, West Fargo, ND (US)

(73) Assignee: DEERE & COMPANY, Moline, IL (US)

( * ) Notice: Subject to any disclaimer, the term of this patent is extended or adjusted under 35 U.S.C. 154(b) by 0 days.

(21) Appl. No.: 16/167,528

(22) Filed: Oct. 22, 2018

(65) Prior Publication Data

US 2020/0126890 A1 Apr. 23, 2020

(51) Int. Cl.
*H01L 23/427* (2006.01)
*H01L 23/492* (2006.01)
*H01L 23/367* (2006.01)
*F28D 20/02* (2006.01)

(52) U.S. Cl.
CPC .......... *H01L 23/427* (2013.01); *F28D 20/023* (2013.01); *H01L 23/367* (2013.01); *H01L 23/4922* (2013.01)

(58) Field of Classification Search
CPC ... H01L 23/427; H01L 23/367; F28D 20/023; F28D 2021/0028; F28D 2021/0029
See application file for complete search history.

(56) References Cited

U.S. PATENT DOCUMENTS

| | | | | |
|---|---|---|---|---|
| 6,085,831 A * | 7/2000 | DiGiacomo | ........ | F28D 15/0233 165/104.26 |
| 6,307,871 B1 * | 10/2001 | Heberle | ................... | F28D 20/02 372/34 |
| 6,550,531 B1 | 4/2003 | Searls et al. | | |
| 6,934,154 B2 * | 8/2005 | Prasher | ............... | F28D 15/0266 165/185 |
| 7,017,655 B2 | 3/2006 | Wilson et al. | | |
| 7,352,585 B2 * | 4/2008 | Mandel | ............... | H01L 21/4878 361/714 |
| 8,541,875 B2 * | 9/2013 | Bennion | ................. | H01L 23/36 257/706 |
| 8,812,169 B2 | 8/2014 | Leech et al. | | |
| 9,564,385 B2 | 2/2017 | Schmit et al. | | |

(Continued)

FOREIGN PATENT DOCUMENTS

| | | |
|---|---|---|
| DE | 102014109489 A1 | 1/2016 |
| EP | 3379909 A1 | 9/2018 |
| WO | 2017175686 A1 | 2/2019 |

OTHER PUBLICATIONS

European Search Report issued in counterpart European Patent Application No. 19204718.1, dated Mar. 26, 2020 (8 pages).

*Primary Examiner* — Victoria K. Hall

(57) ABSTRACT

A semiconductor device comprises a generally planar semiconductor chip. The semiconductor chip comprises a first side and second side opposite the first side. The first side is associated with a source conductive pad. The second side is associated with a drain conductive pad. A gate pad overlies a portion of the first side. A source terminal comprises a metallic strip assembly with a series of pocket chambers spaced apart from each other and partially filled with a phase-change material filling. A drain terminal is spaced apart from the source terminal by a dielectric layer. The source terminal is bonded to the source conductive pad via a bonding interface material.

18 Claims, 9 Drawing Sheets

(56) References Cited

U.S. PATENT DOCUMENTS

| | | | | |
|---|---|---|---|---|
| 10,502,498 B2* | 12/2019 | Huang | | F28D 15/046 |
| 10,619,942 B2* | 4/2020 | Fujisaki | | B32B 27/14 |
| 2003/0139071 A1* | 7/2003 | Li | | H01L 23/367 |
| | | | | 439/66 |
| 2004/0100771 A1 | 5/2004 | Luo | | |
| 2004/0190253 A1* | 9/2004 | Prasher | | F28D 15/0233 |
| | | | | 361/699 |
| 2005/0030717 A1* | 2/2005 | Inagaki | | H01L 23/4334 |
| | | | | 361/699 |
| 2005/0139992 A1* | 6/2005 | Holalkere | | H01L 23/427 |
| | | | | 257/706 |
| 2005/0259400 A1* | 11/2005 | Huang | | H01L 23/367 |
| | | | | 361/704 |
| 2006/0232944 A1* | 10/2006 | Zhang | | H01L 23/4006 |
| | | | | 361/719 |
| 2006/0284308 A1* | 12/2006 | Harada | | H01L 25/072 |
| | | | | 257/729 |
| 2007/0159798 A1 | 7/2007 | Chen et al. | | |
| 2007/0246193 A1 | 10/2007 | Bhatti et al. | | |
| 2008/0073062 A1* | 3/2008 | Schuette | | F28D 15/00 |
| | | | | 165/80.4 |
| 2010/0128436 A1* | 5/2010 | Edmunds | | H01L 23/427 |
| | | | | 361/700 |
| 2012/0205086 A1* | 8/2012 | Nakamura | | H01L 23/473 |
| | | | | 165/181 |
| 2012/0280382 A1* | 11/2012 | Im | | H01L 23/3128 |
| | | | | 257/712 |
| 2013/0320517 A1 | 12/2013 | Shirley | | |
| 2016/0013117 A1* | 1/2016 | Woehlert | | H01L 21/4871 |
| | | | | 257/712 |
| 2016/0064308 A1* | 3/2016 | Yamada | | H01L 23/3735 |
| | | | | 257/697 |
| 2016/0341487 A1* | 11/2016 | Konishi | | F28F 3/022 |
| 2017/0069562 A1* | 3/2017 | Ide | | H01L 23/528 |
| 2017/0363373 A1* | 12/2017 | Cai | | H01L 23/427 |
| 2018/0040535 A1* | 2/2018 | Terasaki | | C04B 37/00 |
| 2018/0142961 A1* | 5/2018 | Wu | | F28D 15/0266 |
| 2018/0143671 A1* | 5/2018 | Lee | | G11B 33/1406 |
| 2018/0157297 A1* | 6/2018 | Delano | | G06F 1/206 |
| 2018/0279508 A1* | 9/2018 | Roan | | H01L 23/24 |
| 2019/0035771 A1* | 1/2019 | Iwahashi | | H01L 23/3735 |
| 2019/0348345 A1* | 11/2019 | Parida | | H01L 23/3675 |

* cited by examiner

PACKAGING OF A SEMICONDUCTOR DEVICE WITH PHASE-CHANGE MATERIAL FOR THERMAL PERFORMANCE

FIELD

This disclosure relates to packaging of a semiconductor device with phase-change material for thermal performance.

BACKGROUND

In certain prior art, semiconductor devices, such as insulated-gate, bipolar transistors (IGBT) and metal-oxide-semiconductor field-effect transistors (CMOS), and silicon-carbide (SiC) transistors, have thermal constraints that can limit performance. For vehicle applications, such as off-road vehicles or heavy equipment, the semiconductor devices may be incorporated into power electronic modules, like inverters or converters with heavy duty cycles and/or transient loads that demand high thermal dissipation. Thus, there is a need to make the electronic modules compact consistent with targeted power density and compatible with cooling via the circulation of engine coolant, associated with an internal combustion engine on the vehicle.

SUMMARY

In accordance with one aspect of the disclosure, a semiconductor device comprises a generally planar semiconductor chip. The semiconductor chip comprises a first side and second side opposite the first side. The first side is associated with a source conductive pad. The second side is associated with a drain conductive pad. A gate pad overlies a portion of the first side. A source terminal comprises a metallic strip assembly with a series of pocket chambers spaced apart from each other and partially filled with a phase-change material filling. A drain terminal is spaced apart from the source terminal by a dielectric layer. The source terminal is bonded to the source conductive pad via a bonding interface material.

BRIEF DESCRIPTION OF THE DRAWINGS

Like reference numbers in any set of two or more drawings indicate like elements or features.

DETAILED DESCRIPTION

Figure 1A:
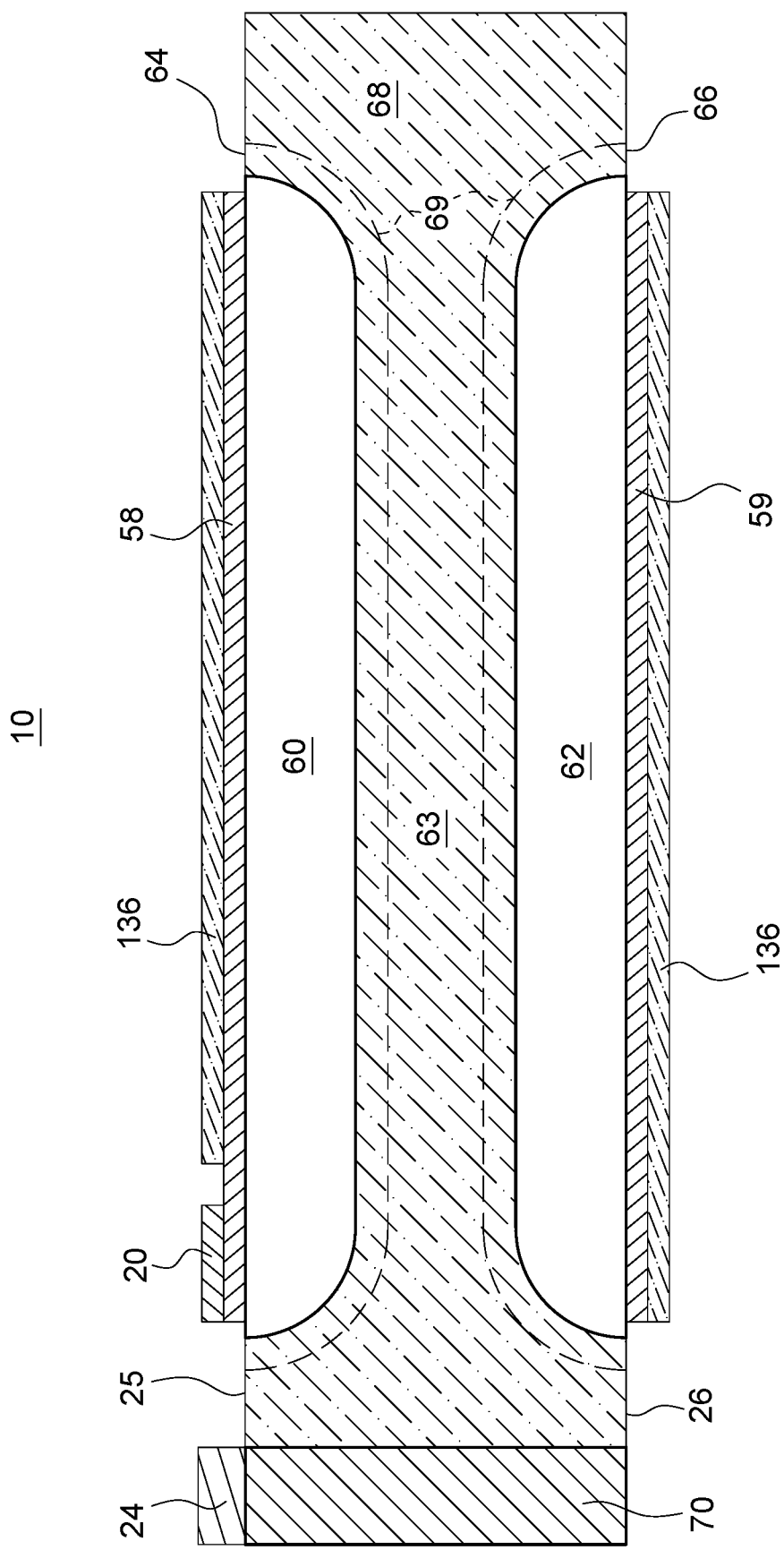
FIG. 1A is a cross section of one embodiment of a semiconductor chip, such as a field-effect transistor.

In accordance with one aspect of the disclosure illustrated in FIG. 1A, a semiconductor device (11 in FIG. 2) comprises a generally planar semiconductor chip 10. The semiconductor chip 10 comprises a first side 25 and second side 26 opposite the first side 25. The first side 25 is associated with a source conductive pad 58 or source metallization, which is a metal layer or metal alloy layer. The second side 26 is associated with a drain conductive pad 59 or drain metallization, which is metal layer or metal alloy layer. A gate pad 24 overlies a portion of the first side 25 or a gate electrode 70 for applying an electrical field in the channel region 63 of the substrate 68, such as a silicon semiconductor substrate (e.g., for a silicon carbide semiconductor). The metal layers can be formed by electrodeposition, electroless deposition, metallization, a direct bond copper process, or other semiconductor fabrication processes. For example, a direct bond copper process allows a copper metal layer or copper metal alloy layer to be bonded to one or more interface layers, such as aluminum oxide, aluminum nitride, or aluminum carbide, on the silicon carbide substrate, a drain region 62, and/or a source region 60.

The semiconductor substrate 68 has a source region 60 below the source conductive pad 58. The source surface 64 may be exposed at or on the first side 25. Similarly, the semiconductor substrate 68 has a drain region 62 and the drain conductive pad 59 overlies the drain region 62. The drain surface 66 may be exposed on the second side 26. In one embodiment, the source region 60 and drain region 62 may be formed inside optional doped n-wells 69 in the semiconductor substrate 68 (e.g., to support fabrication of Complementary Metal Oxide Semiconductors (CMOS)), where the optional n-wells 69 are indicated by dashed lines in FIG. 1A and FIG. 1B. The gate pad 24 has a gate electrode 70 that extends to provide or control an electric field in a region or channel region 63 between a source region 60 and the drain region 62. For example, the gate pad 24 or gate electrode 70 is attached to the gate metallization of the semiconductor chip 10.

Figure 2:
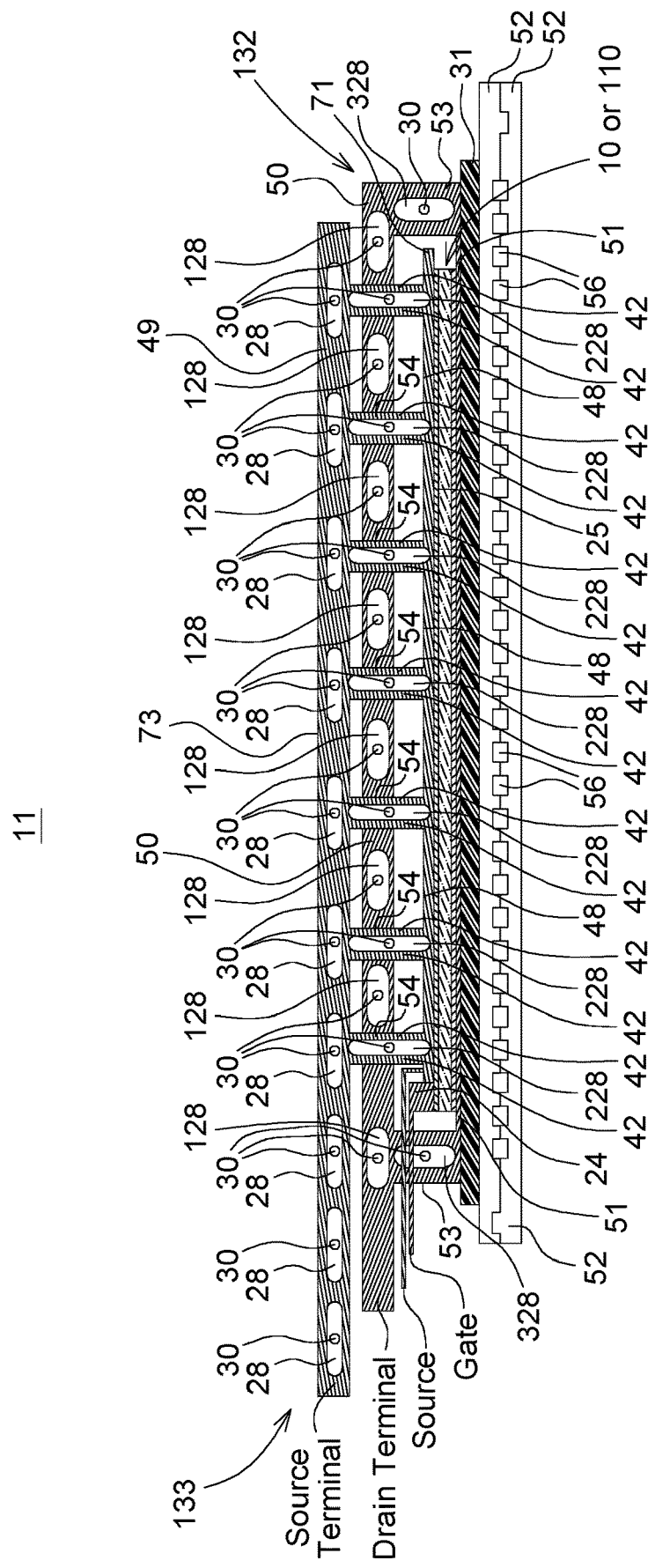
FIG. 2 is a cross section of an embodiment of a semiconductor device incorporating the semiconductor chip of FIG. 1A (or FIG. 1B) and associated packaging with phase-change material for enhanced thermal performance.

In FIG. 1A, a bonding interconnect material 136 overlies the source conductive pad 58 to facilitate electrical and mechanical interconnection of the source conductive pad 58 to a source terminal or source terminal assembly 133, as illustrated in FIG. 2. Similarly, a bonding interconnect material 136 overlies the drain conductive pad 59 to facilitate electrical and mechanical interconnection of the drain conductive pad 59 to a drain terminal or drain terminal assembly 132, as illustrated in FIG. 2. During manufacturing or assembly of the semiconductor device 10, the surface of the drain terminal assembly 132 may be coated or treated with an uncured bonding interconnect material 136 (e.g., adhesive, such as epoxy, and metal particles to form an electrically conductive film) for electrically connecting and/ or adhesively bonding the drain surface 66 of the semiconductor chip 10 to the drain terminal in FIG. 1A and FIG. 2.

In one embodiment, the bonding interconnect material 136 or binding interconnect material comprises an electrically conductive adhesive, such as an adhesive matrix with metal or metallic filler (e.g., silver or other metal or metal alloy particles). Further, the bonding interconnect material 136 may have suitable thermal conductivity to transfer thermal energy generated by the semiconductor chip 10 to the source terminal (e.g., source terminal assembly 133) and drain terminal (e.g., drain terminal assembly 132), or heat sinks associated with the source terminal (upper heat sink 152 or lower heat sink 252), the drain terminal (central heat sink 52), or both.

In an alternate embodiment, the bonding interconnect material 136 is omitted; the source conductive pad 58 is directly bonded to the source terminal assembly 133; the drain conductive pad 59 is directly bonded to the drain terminal assembly 132, where the source conductive pad 58, the drain conductive pad 59, the source terminal assembly 133, and the drain terminal assembly 132 are composed of copper or copper alloys that can be fused or brazed together with application of suitable heat, or a suitable combination of heat and pressure, with or without a zinc coating or zinc interface layer.

In FIG. 2, a drain terminal assembly 132 is spaced apart from the source terminal assembly 133 by a dielectric layer or dielectric filler (not shown). The source terminal assembly 133 is bonded to or electrically connected to the source conductive pad 58 via a bonding interconnect material 136 or conductive adhesive in FIG. 1A and FIG. 2, collectively. The drain terminal assembly 132 is bonded to or electrically connected to the drain conductive pad 59 via a bonding interconnect material 136 or conductive adhesive in FIG. 1A and FIG. 2, collectively.

Figure 1B:
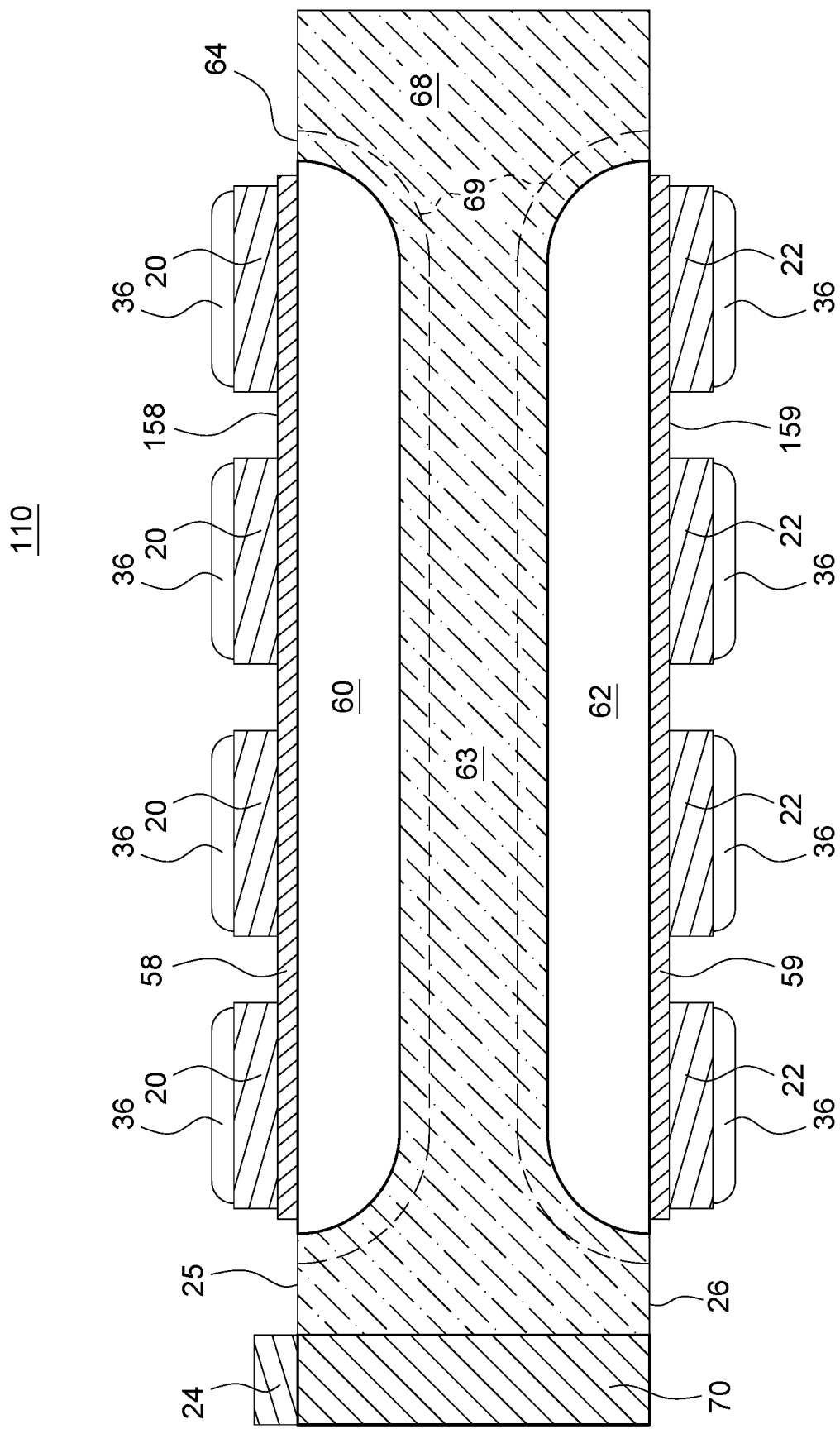
FIG. 1B is a cross section of another embodiment of a semiconductor chip, such as field-effect transistor.

The embodiment of the semiconductor chip 10 illustrated in FIG. 1A is similar to the different embodiment of the semiconductor chip 110 illustrated in FIG. 1B, except the semiconductor chip 110 of FIG. 1B has a set or an array of outer conductive pads (20, 22; e.g., secondary conductive pads) that overlie inner conductive pads (158, 159; e.g., primary conductive pads or metallization), where the outer conductive pads (20, 22) have thickness suitable for soldering, brazing or forming an electrical and mechanical connection to a source terminal assembly 133 and a drain terminal assembly 132 via solder, solder fortified with copper or copper alloys, or another bonding interface material 36. The outer conductive pads (20, 22) are generally thicker than the inner conductive pads (158, 159), or metallization, and have gaps between rows or columns of pads to allow solder material or bonding interface material 36 to flow into the gaps during heating or baking in a reflow process or oven, or incidental to another soldering process. The source inner conductive pad 158 overlies the source region 60; drain inner conductive pad 159 overlies the drain region 62. In turn, the source outer conductive pad 20 overlies the source inner conductive pad 158; the drain outer conductive pad 22 overlies the drain inner conductive pad 159.

In FIG. 1B, the outer conductive pads (20, 22; e.g., secondary conductive pads) that overlie inner conductive pads (158, 159; e.g., primary conductive pads or metallization) can be formed by electrodeposition, electroless deposition, metallization, a direct bond copper process, or other semiconductor fabrication processes. For example, a direct bond copper process allows a copper metal layer or copper metal alloy later to be bonded to one or more interface layers, such as aluminum oxide, aluminum nitride, or aluminum carbide, on the silicon carbide substrate, a drain region 62, and/or a source region 60.

In FIG. 1A, FIG. 1 B and FIG. 2, collectively, the source terminal assembly 133 and drain terminal assembly 132 are associated with or bonded to outer conductive pads or secondary conductive pads, such as source outer conductive pads 20 and drain outer conductive pads 22. The outer conductive pads, such as the source outer conductive pads 20, may be coated or treated with a bonding interface material 36 (e.g., lead-free solder, solder with copper or solder paste) for connecting the source outer conductive pad 20 of the semiconductor chip (10 or 110) to the source terminal assembly 133. The outer conductive pads, such as the drain outer conductive pads 22, may be coated or treated with a bonding interface material 36 (e.g., lead-free solder, solder with copper, or solder paste) for connecting the drain outer conductive pad 22 of the semiconductor chip 10 to the drain terminal assembly 132. In one configuration, the bonding interface material 36 is composed of solder or the combination of lead-free solder (e.g., tin bismuth or tin silver) and copper.

The source terminal assembly 133 is bonded to the combined source conductive pad (158, 20) via a bonding interface material 36 or solder in FIG. 1B and FIG. 2, collectively. The drain terminal assembly 132 is bonded to the combined drain conductive pad (159, 22) via a bonding interface material 36 or solder in FIGS. 1B and 1*n* FIG. 2, collectively.

In an alternate embodiment, the bonding interface material 36 is omitted; the source conductive pad 158 (or source outer conductive pad 20) is directly bonded to the source terminal assembly 133; the drain conductive pad 159 (or drain outer conductive pad 22) is directly bonded to the drain terminal assembly 132, where the source conductive pad 158 (or source outer conductive pad 20), the drain conductive pad 159 (or drain outer conductive pad 22), the source terminal assembly 133, and the drain terminal assembly 132 are composed of copper or copper alloys that can be fused or brazed together with application of suitable heat, or a suitable combination of heat and pressure, with or without a zinc coating or zinc interface layer.

In FIG. 1B and FIG. 2, collectively, the source terminal assembly 133 and drain terminal assembly 132 (e.g., current carrying power terminals) are mechanically and electrically connected to sets of source outer conductive pads 20 and sets of drain outer conductive pads 22, respectively. The drain outer conductive pads 22 are wired or arranged as parallel connections to the drain inner conductive pad 159; the source outer conductive pads 20 are wired or arranged as parallel connections to the source inner conductive pads 158. Meanwhile, one or more control terminals are bonded to the gate pad 24 or a set of gate pads. Optionally, an additional control terminal is coupled to the source pads or Kelvin source pad. The drain terminal and source terminal are regarded as power terminals that can switch output current between the power terminals.

In any embodiment, such as FIG. 1A, FIG. 1B and FIG. 2, the semiconductor chip (10 or 110) may comprise a silicon-carbide (SiC), metal-oxide-semiconductor field-effect-transistor (MOSFET). In FIG. 1A or FIG. 1B, a representative example of the SiC power MOSFET chip or chipset is illustrated. FIG. 1A or FIG. 1B shows a simplified illustration of a single MOSFET chip while a SiC power module may consist of MOSFET chipsets or CMOSFET, generally connected in parallel.

In FIG. 2, in one embodiment the source terminal assembly 133 comprises a source inner section 48, a source outer section 49 and source stem sections 42 that interconnect the source inner section 48 and the source outer section 49. The source inner section 48 has an inner planar surface 71 for attachment to: (1) the source conductive pad 58 via the bonding interconnect material 136, or (2) the source outer conductive pad 20 via the bonding interface material 36. Meanwhile, the source outer section 49 has an outer planar surface 73 for attachment to a heat sink (e.g., upper heat sink 152 in FIG. 5) via a dielectric layer (e.g., 131 in FIG. 5) or dielectric thermal interface material.

In one embodiment, a source terminal assembly 133 comprises a metallic strip assembly with a series of pockets (28, 228) or chambers spaced apart from each other and partially filled with a phase-change material 30 or refrigerant filling. For example, pockets 28 may be located in the source inner section 48, the source outer section 49 and the source stem sections 42, and the pockets (28, 228) may be partially filled with the phase-change material 30 or refrigerant filling. In one configuration the refrigerant or phase-change material 30 may comprise any commercially available refrigerant, such as R-22 or R-235 and variants thereof.

During operation of the semiconductor device, one or more semiconductor chips (10 or 110) generate thermal energy that is conducted to the drain terminal assembly 132 and the source terminal assembly 133. In each terminal assembly (132, 133), the refrigerant within one or more pockets (28, 128, 228, 328) evaporates and changes from a liquid phase to a gas phase, while absorbing and dissipating the thermal energy (e.g., generated by one or more semiconductor chips 10 or 110). As the gas phase of the phase-change material 30 cools, typically in an upper portion of the pockets (28, 128, 228, 328), the gas phase of the phase-change material 30 condenses to a liquid phase and, by gravity, drips, runs or flows toward a lower portion of the pockets (28, 128, 228, 328). In a liquid phase, the phase-change material 30 is available or ready to transition through another phase-change cycle from evaporation to condensation and then returning to evaporation, as an iterative process that absorbs or dissipates the thermal energy (e.g., generated by one or more semiconductor chips 10 or 110).

In FIG. 2, in one embodiment the drain terminal assembly 132 comprises a drain inner section 51, a drain outer section 50 and drain stem sections 53 (e.g., a pair of stems on either side of the semiconductor chip 10 or 110) that interconnect the drain inner section 51 and the drain outer section 50. The drain inner section 51 has an inner planar surface for attachment to: (1) the drain conductive pad 59 via the bonding interconnect material 136, or (2) the drain outer conductive pad 22 via the bonding interface material 36. The drain terminal assembly 132 has an opening 54 or volume in the drain outer section 50 and the source stem section 42 extends through the opening 54 and is electrically isolated from the opening 54 and drain terminal assembly 132 by spatial separation or dielectric insulation. The semiconductor chip (10 or 110) is positioned in a volume between and defined by the drain inner section 51 and the source inner section 48. In one embodiment, the semiconductor chip has a semiconductor substrate 68 or channel region 63 that electrically separates and isolates the source terminal assembly from the drain terminal assembly when the semiconductor chip (10 or 110) is in the open or non-conducting mode, which can depend upon whether the transistors are configured to operate in a depletion mode or enhancement mode.

In one embodiment, the drain terminal assembly 132 further comprises a metallic strip assembly with a series of pockets 128 or chambers spaced apart from each other and partially filled with a phase-change material 30 or refrigerant filling. In one configuration, the series of pockets 128 or chambers of the drain terminal assembly 132 are substantially oval or substantially spherical and wherein the phase-change material 30 or refrigerant filling comprises a refrigerant, such as commercially available refrigerants that are used for automotive air-conditioning systems or air-conditioning systems for off-road vehicles.

Like the source terminal assembly 133, the drain terminal assembly 132 comprises a metallic strip assembly with a series of pocket (128, 328) or chambers spaced apart from each other and partially filled with a phase-change material 30 filling. In one configuration, the series of pocket (128, 328) chambers of the drain terminal assembly 132 are substantially oval or substantially spherical and wherein the phase-change material 30 or filling comprises a refrigerant.

The source terminal assembly 133, with the pockets (28, 228) partially filled with a phase-change material 30 filling, and the drain terminal assembly 132, with the pockets (128, 328) partially filled with a phase-change material 30 filling, can be manufactured by additive manufacturing techniques or by three-dimensional printing. The phase-change material 30 function as thermal shock absorbers to dampen transient thermal variation or swings in temperature of the semiconductor device (11 or 111) that would otherwise occur. The phase-change material 30 keeps the transistor junction, such as silicon-carbide transistor junction temperature, of the semiconductor device (11 or 111) within a narrow range while the load on the semiconductor device (11 or 111), or the inverter that incorporates the semiconductor device (11 or 111), varies widely. Accordingly, the packaging of the semiconductor device (11 or 111) supports longevity of the semiconductor device (11 or 111) and its electrical interconnects (e.g., terminals) in demanding environments associated with inverters or power electronic modules that are cooled by engine coolant associated with internal combustion engines.

As illustrated in FIG. 2, in one embodiment, a central heat sink 52 is in thermal communication with the drain terminal assembly 132 (e.g., a drain inner planar surface of the drain inner section 51) via a dielectric layer 31 of thermal interface material. For example, the thermal interface material may comprise a thermal interface layer, film or sheet with a dielectric strength of equal to or greater than approximately 10 Kilovolt/centimeter (kV/cm). In one embodiment, the central heat sink 52 may be formed of copper or copper alloy and may be directly bonded (via dielectric layer 31 of thermal interface material) to the drain terminal assembly 132 to eliminate ceramic substrate (that typically supports the drain terminal on some packages) and improve thermal performance of the packaging of the semiconductor device 11. For instance, the central heat sink 52 may be additive manufactured base-plate composed of copper composite with cooling channels 56 center at the bond line, where the copper composite reduces any differential in the coefficient of thermal expansion between the drain terminal assembly 132 (composed of copper or copper alloy) and the central heat sink 52 (composed of copper, copper alloy and copper composite).

In an alternate embodiment the central heat sink 52 is composed of a dielectric material, such as ceramic, a polymer, a plastic, a composite, a fiber-filled polymer or a fiber-filled plastic. Accordingly, if the central heat sink 52 is composed of a dielectric material, the dielectric layer 31, the thermal interface layer, film or sheet may be eliminated between the central heat sink 52 and the drain terminal assembly 132.

In FIG. 2, the central heat sink 52 comprises a base plate with channels 56 for holding or circulating a coolant. In the central heat sink 52, channels 56 comprise a set of parallel channels 56 or circuitous channels 56 that are in hydraulic communication with an inlet port (not shown) and an outlet port (not shown) for coolant. Although the channels 56 of the central heat sink 52 are illustrated as generally rectangular cross sections, the channels 56 may have generally elliptical, oval, circular or other cross-sectional shapes. The inlet port or the outlet port for the coolant may be connected to or in hydraulic communication with a radiator of an internal combustion engine (e.g., of an off-road vehicle or heavy equipment). Further, the coolant may comprise an ethylene glycol-water mixture or another anti-freeze coolant.

FIG. 2 has packaging for the semiconductor chip 10 or semiconductor device 11 that is well-suited for higher thermal loads and heat dissipation than otherwise possible without the central heat sink 52 and without phase-change material 30 filling in one or more conductive terminals (such as the drain terminal assembly 132 and the source terminal assembly 133 composted of metal or metal alloy) of the semiconductor chip 10 or semiconductor device 11.

In one embodiment, the source terminal assembly 133 or metallic strip assembly comprises a source inner section 48 (e.g., inner source section), a source outer section 49 (e.g., outer source section), and a source stem section 42. The source inner section 48, the source outer section 49 and the source stem sections 42 represent portions of the source terminal assembly 133. The source outer section 49 or source outer portion is spaced apart from the source inner section 48 and substantially parallel to the source inner section 48. Conductive vertically-extending, source stem sections 42 or portions extend between a source inner section 48 and a source outer section 49.

In one configuration, the vertically extending source stem sections 42 or source stem portions pass through openings 54 in the drain terminal assembly 132 and are electrically isolated from the drain terminal assembly 132 (e.g., by spatial separation between the source stem section 42 and the opening 54 in the drain terminal assembly 132, or by a dielectric sealant, dielectric layer 31 or dielectric filler.

In another configuration, each of the source stem sections 42 or step portions comprise a metallic strip with one or more pocket 228 or chambers partially filled with a phase-change material 30 or refrigerant filling. For example, the pockets 228 may be substantially spherical, hemispherical or have elliptical, oblong or oval cross-sections with a longer axis oriented vertically within the source stem sections 42.

In one embodiment, the drain terminal assembly 132 or metallic strip assembly comprises a drain inner section 51 and a drain outer section 50 that are interconnected by drain stem sections 53. The drain outer section 50 is spaced apart from the drain inner section 51 and substantially parallel to the drain inner section 51. The drain inner section 51, the drain outer section 50 and the drain stem sections 53 represent portions of the drain terminal assembly 132. Conductive vertically-extending drain stem sections 53 extend between a drain inner section 51 (or inner drain portion) and a drain outer section 50 (or outer drain section). Each of the drain stem sections 53 may comprise a metallic strip with one or more pockets 328 or chambers partially filled with a phase-change material 30 or refrigerant filling. For example, the pockets 328 may be substantially spherical, hemispherical or have elliptical, oblong or oval cross-sections with a longer axis oriented vertically within the source stem sections 42.

As illustrated in FIG. 2, drain and source terminal assemblies (132, 133) are attached to the semiconductor device 11 (e.g., SiC MOSFET chipsets), and the resultant package is ready for bonding with the central heat sink 52. The drain and source terminals (132, 133) can be fabricated by the additive manufacturing process, such as by three-dimensional printing. The drain and source terminals (132, 133) can be coupled or bonded, directly or indirectly, to the drain conductive pad (59, 159) and source conductive pad (58, 158) of the semiconductor chip 10 or semiconductor die by a conductive adhesive or another bonding interconnect material 136, where the conductive adhesive might be fabricated by an additive manufacturing process, such as by three-dimensional printing.

The pockets (28, 128, 228, 328) or chambers in the drain and source terminals (132, 133) are filled with the phase-change-material (PCM or PCM sheet), where the phase-change material 30 may be filled in the pockets (28, 128, 228, 328) during an additive manufacturing process. Alternately, after the additive manufacturing process the phase-change material 30 is charged, pressurized or injected into the pockets (28, 128, 228, 328) through filling channels that are later plugged (e.g., with caps, plugs, filler or sealant) or closed while retaining the phase-change material 30 in the pockets (28, 128, 228, 328). When appropriately filled with the PCM, the drain and source terminals (132, 133) function like transient heat suppressors. Therefore, under extreme electrical loading conditions, the semiconductor chip 10 or semiconductor die tends to experience merely a marginal change in its transistor junction temperature. In this manner, electrical and thermal properties of the semiconductor chip 10 are optimized/enhanced for high reliability by using additive manufacturing processes for the high-current drain and source terminals, and terminals filled with PCM. Accordingly, the semiconductor device (11 or 111) with packaging are suitable for applications requiring extreme vibrations, thermal shocks and large number of temperature/power cycles.

Figure 3:
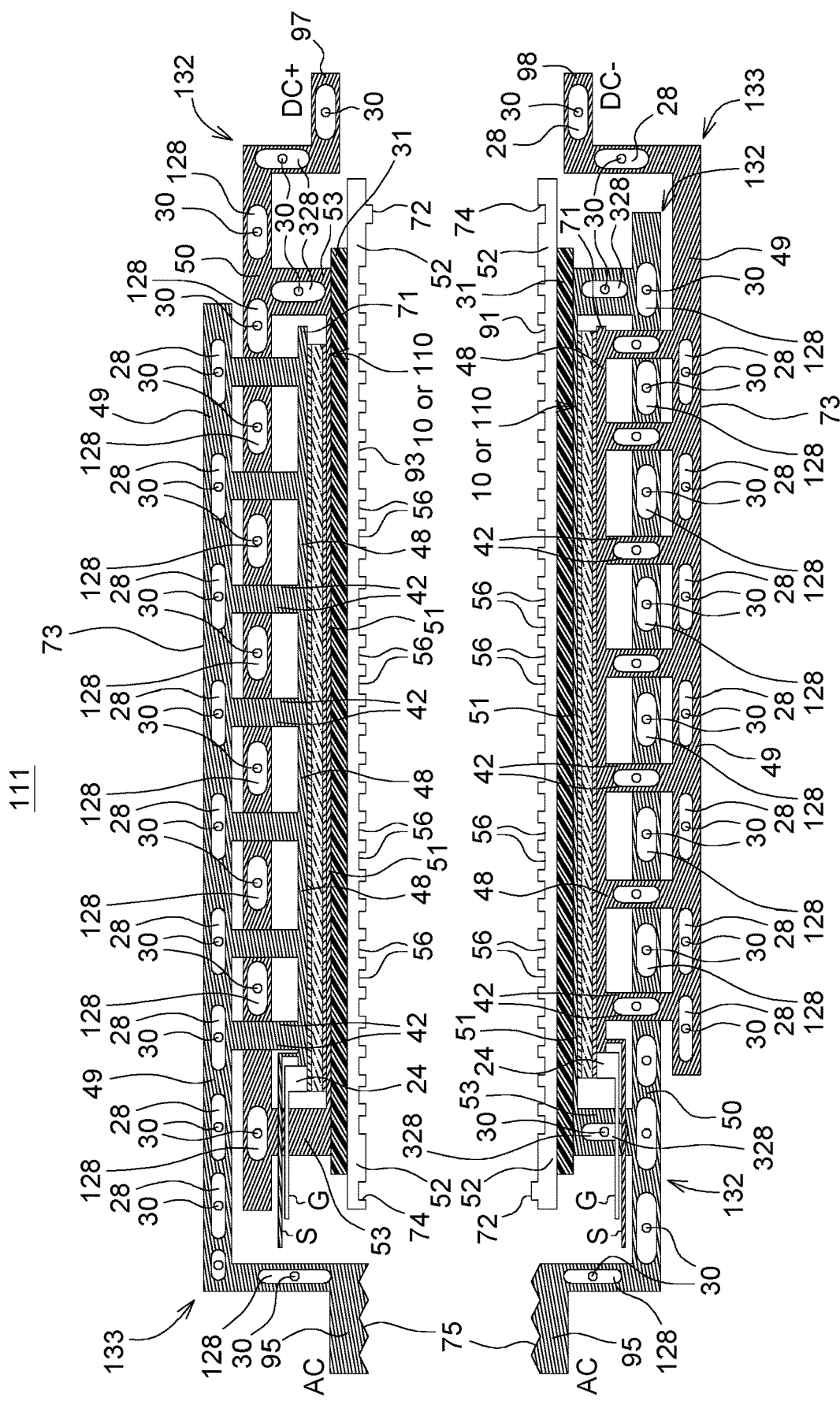
FIG. 3 is a cross sectional exploded view of one embodiment of a semiconductor device module incorporating two semiconductor chips of FIG. 1A (or FIG. 1 B), during assembly.
Figure 4:
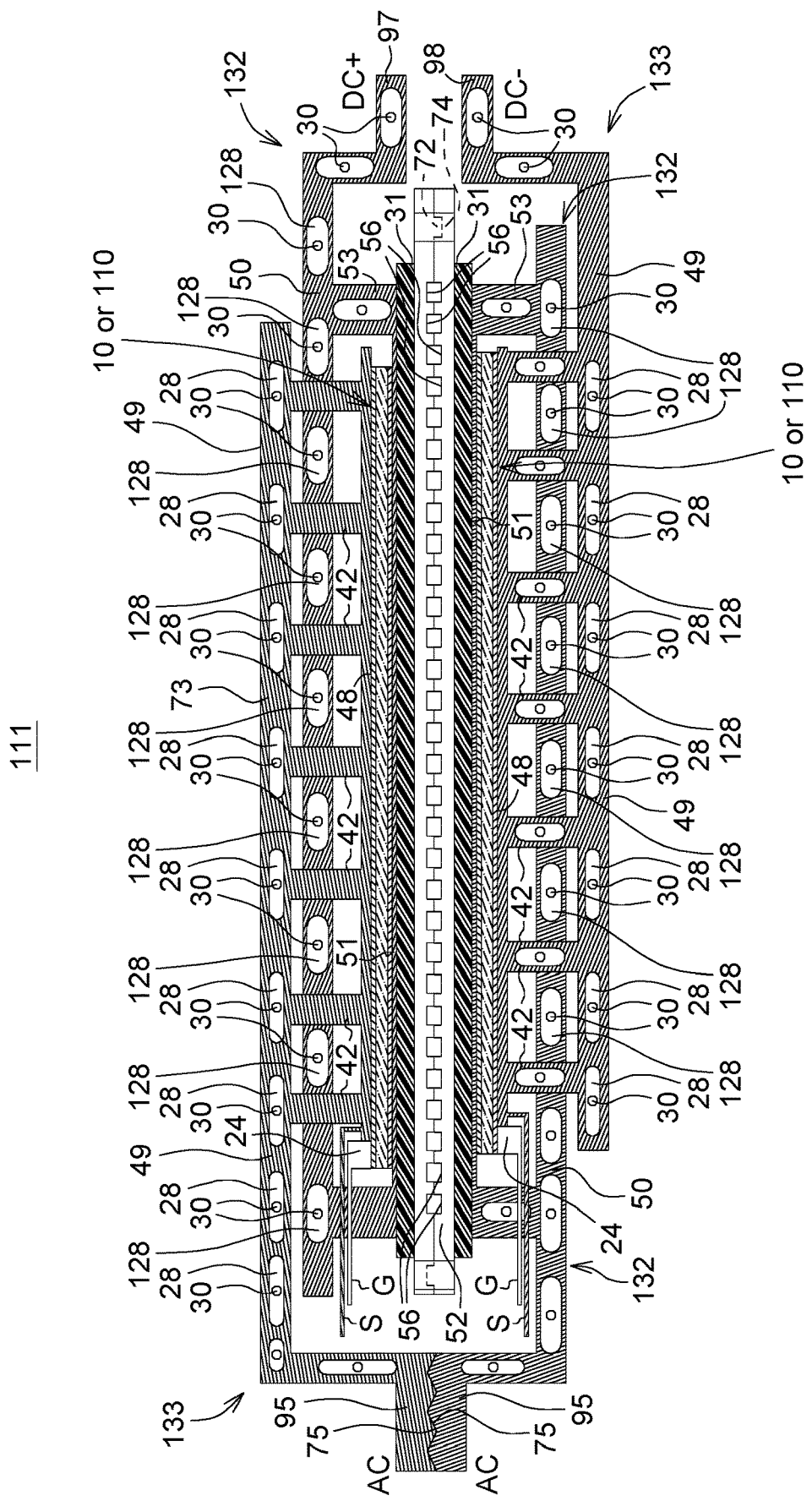
FIG. 4 is a cross-sectional view of a semiconductor device module of FIG. 3 incorporating two semiconductor chips, after assembly.

In FIG. 3 and FIG. 4, a semiconductor device 11 module with two semiconductor chips 10 (e.g., two transistors) is illustrated, where the switched terminals (e.g., drain terminals and source terminals) of the transistors are coupled in series. For example, the semiconductor device 111 may comprise a high-side field effect transistor and a low-side field effect transistor of a single phase of an inverter. Like reference numbers in FIG. 1A through FIG. 4, inclusive, indicate like elements or features.

In FIG. 3 and FIG. 4, a generally planar first semiconductor chip 10 has the first side 25 (e.g., outer side) and the second side 26 (e.g., inner side opposite the outer side). The first side 25 or outer side is associated with a first source conductive pad (58 or 158). The second side 26 or inner side is associated with a first drain conductive pad (59 or 159). A first gate pad 24 overlies a portion of the first side 25 or outer side.

A first source terminal assembly 133 comprises a metallic strip assembly with a series of pockets 28 or chambers spaced apart from each other and partially filled with a phase-change material 30 or refrigerant filling. A first drain terminal assembly 132 is spaced apart from the first source terminal 133 by a dielectric region (in the spatial regions, volumes or voids between assemblies 133, 132 that is not occupied by chip 10) and the first semiconductor chip 10. The first source terminal assembly 133 is coupled or bonded, directly or indirectly, to the first source conductive pad (58, 158) via a bonding interconnect material 136 or a bonding interface material 36 (e.g., solder fortified with copper or a copper alloy).

A generally planar second semiconductor chip (10 or 110) comprises a second side 26 (e.g., upper side) and first side 25 (e.g., an inner side opposite the outer side). The second side 26 or upper side is associated with a second drain conductive pad (59 or 159). The first side 25 or outer side is associated with a second source conductive pad (58 or 158). A second gate pad 24 overlies a portion of the first side 25 or outer side.

A second source terminal assembly 133 comprises a metallic strip assembly with a series of pockets (28, 228) or chambers spaced apart from each other and partially filled with a phase-change material 30 or refrigerant filling. A second drain terminal assembly 132 is spaced apart from the second source terminal by a second dielectric region (in the spatial regions, volumes, or voids between assemblies 133, 132 that is not occupied by the chip 10 or 110) and the second semiconductor chip (10 or 110). The second source terminal assembly 133 is coupled or bonded, directly or indirectly, to the second source conductive pad (58, 158) via a bond interface material.

In one configuration, the first drain terminal assembly 132 further comprises a metallic strip assembly with a series of pocket (128, 328) or chambers spaced apart from each other and partially filled with a phase-change material 30 or refrigerant filling; the second drain terminal assembly 132 further comprises a metallic strip assembly with a series of pockets (128, 328) or chambers spaced apart from each other and partially filled with a phase-change material 30 or refrigerant filling.

In one embodiment, the semiconductor device 11 module comprises an intermediate heat sink or central heat sink 52 between the first semiconductor chip 10 and the second semiconductor chip (10 or 110). The intermediate heat sink or central heat sink 52 is in thermal communication with the first drain terminal assembly 132 via a first dielectric layer 31, such as thermal interface material. The central heat sink 52 is in thermal communication with the second drain terminal assembly 132 via a second dielectric layer 31, such as a thermal interface material. In one configuration, the central heat sink 52 comprises a base plate with channels 56 for holding or circulating a coolant, such as a set of substantially parallel channels that occupy a majority of the width of the base plate.

FIG. 3 depicts how double-sided-cooled high-side and low-side semiconductor chips (10, 110) or transistors (e.g., silicon-carbide MOSFETs) are incorporated into the packaging for the semiconductor device 111. In one embodiment, the coolant channels 56 shown in FIG. 3 are configured as channels 56 or aligned grooves in a first portion 91 (lower portion) and in second portion 93 (upper portion) of the central heat sink 52, where the channels 56 or aligned grooves may be referred to as open-pit-mini-channels 56 (OPMCs). The first portion 91 has a first mating portion and the second portion has a second mating portion that engages or interlocks with the first mating portion. As illustrated in FIG. 3, the first mating portion of the first portion 91 has a left protrusion 72 on one side and a right slot 74 on the other side; the second mating portion of the second portion 93 has a left slot 74 and right protrusion 72; the left protrusion 72 engages and faces the left slot 74 and the right protrusion 72 engages and faces the right slot 74 for an interlocking seal. In one embodiment, the first mating portion and the second mating portion of the first portion and the second portion, respectively, are engaged to form a hermetic seal or seal that can withstand a target coolant pressure and temperature, such as approximately 60 pounds per square inch (psi) at coolant temperature of approximately 115 degrees Celsius.

If the channels 56 or grooves in the central heat sink 52 are not composed of a dielectric material or corrosion-resistant plastic or polymer, the interior surfaces of the channels 56 can be coated or plated to prevent corrosion. The anti-corrosion plating of the channels 56 prevents any degradation that can otherwise be caused by the high-temperature and high-pressure coolant flow through the channels 56. The anti-corrosion plating of the channels 56 ensures that the cooling system continues to offer rapid heat withdrawal capability and can offer a heat removal path generated by the switching and conduction losses incurred in the heat-generating semiconductor chipsets (10, 110).

FIG. 4 illustrates the high-side and low-side semiconductor chips (10, 110) in a semiconductor device 111 where the first portion 91 and the second portion 93 of the central heat sink 52 are united and engaged such that the channels 56 are sealed to prevent leak of any coolant/fluid (e.g., ethylene glycol water) to the external environment. The coolant channels 56 are in hydraulic communication with an inlet and an outlet to support circulation of coolant from a cooling system of a vehicle, such as a radiator, coolant pump and hoses or conduit.

As illustrated in FIG. 4, the alternating current (AC) bus terminal 95 or AC bus bar for high-side and low-side semiconductor chips (10, 110) or dies are bonded together to form an extremely low-resistance electrical connection, such as a contact resistance of less than approximately five micro ohms. At the alternating current terminal 95, the electrical connection of the semiconductor chips (10, 110) are bonded together by a conductive adhesive with a low coefficient of thermal expansion differential with respect to the engaging alternating current terminals that may have interlocking surfaces 75, interlocking-waved, generally grooved, or saw-tooth surfaces.

A low-resistance electrical connection formed by the high-side and low-side AC bus terminal 95 ensures that under peak loading, the packing of the semiconductor device 111 does not generate any excessive heat at the electrical interface between the high-side and low-side semiconductor chips (10, 110) or transistors in the package. The low-resistance electrical contacts ensure that premature thermal degradation of the proposed power module does not occur and long-term reliability of the electrical interconnects is assured.

Figure 5:
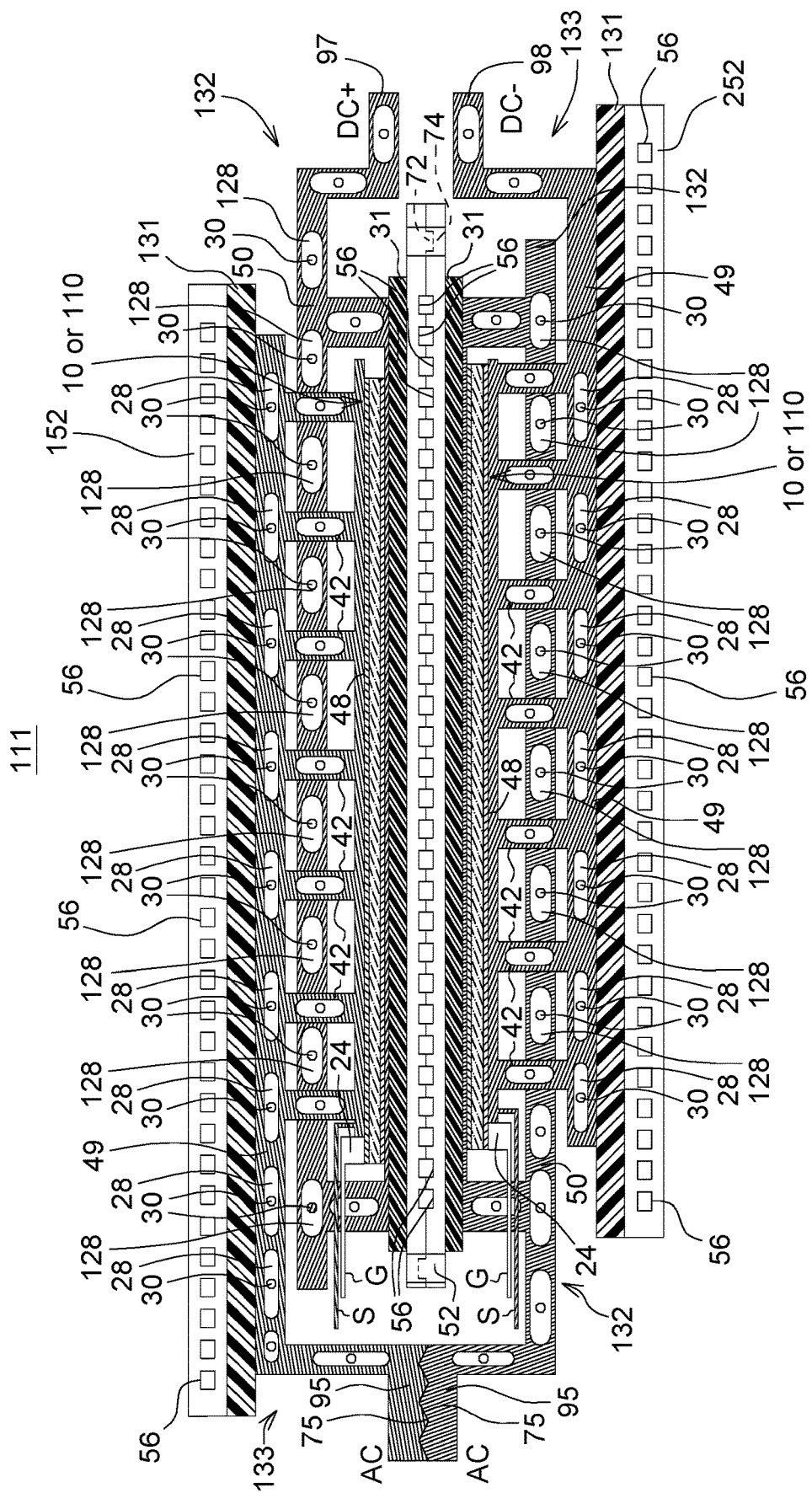
FIG. 5 is a cross-sectional view of the semiconductor device of FIG. 4 further comprising outer heat sinks.

In FIG. 5, the semiconductor device 111 module further comprises an upper heat sink 152 above the first semiconductor chip 10, where the upper heat sink 152 is in thermal communication with a source outer section 49 of the first source terminal assembly 133. The upper heat sink 152 may be electrically isolated from the first source terminal assembly 133 or the source outer section 49 of the first source terminal assembly 133 by a dielectric layer 131, such as a dielectric thermal interface material layer.

In an alternate embodiment the upper heat sink 152 is composed of a dielectric material, such as ceramic, a polymer, a plastic, a composite, a fiber-filled polymer or a fiber-filled plastic.

In one example, the upper heat sink 152 comprises a base plate with channels 56 for holding or circulating a coolant. In the upper heat sink 152, or lower heat sink 252, channels 56 comprise a set of parallel channels, circuitous channels, or fluid paths that are in hydraulic communication with an inlet port and an outlet port for coolant. Although the channels 56 of the upper heat sink 152 or lower heat sink 252 are illustrated as generally rectangular cross sections, the channels 56 may have generally elliptical, oval, circular or other cross-sectional shapes. The inlet port or the outlet port for the coolant may be connected to or in hydraulic communication with a radiator of an internal combustion engine. Further, the coolant may comprise an ethylene glycol-water mixture or another anti-freeze coolant.

Similarly, in FIG. 5, a lower heat sink 252 is disposed below the second semiconductor chip (10 or 110), where the lower heat sink 252 is in thermal communication with the source outer section 49 of the second source terminal assembly 133. For example, the lower heat sink 252 comprises a base plate with channels 56 for holding or circulating a coolant. The lower heat sink 252 may be electrically isolated from the second source terminal or the lower section of the second source terminal assembly 133 by a dielectric layer 131, such as a dielectric thermal interface material layer.

In an alternate embodiment the lower heat sink 252 is composed of a dielectric material, such as ceramic, a polymer, a plastic, a composite, a fiber-filled polymer or a fiber-filled plastic.

In one configuration, the positive direct current (DC) terminal 97 is at the high-side drain terminal assembly 132 and the negative direct current (DC) terminal 98 is at the low-side source terminal assembly 133 that can be manufactured by additive techniques. Meanwhile, the high-side source terminal assembly 133 and low-side drain terminal assembly 132 are electrically and mechanically connected at the alternating current output terminal. The high-side source terminal assembly 133 and the low-side drain terminal assembly 132 can be manufactured by additive techniques and are bonded together by conductive adhesive. The semiconductor chip (10 or 110) or dies are tightly bonded with the laminated direct current bus-bar (positive direct current terminal 97 for high-side drain terminal assembly 132 and negative direct current terminal 98 for lower-side source terminal assembly 133). The arrangement of the direct current bus-bar (97, 98) supports a minimal loop inductance to enable faster switching; hence, reduce the energy loss during the turn-off transition of semiconductor chips (10, 110) or dies.

As illustrated in FIG. 5, the low-side source terminal assembly 133 of the package gets further thermal relief by using a lower heat sink 252 associated with, in thermal contact or communication with, the low-side source terminal assembly 133, such as coupled to the low-side source terminal assembly 133 via a dielectric layer 131 (e.g., dielectric thermal interface material). Similarly, the high-side source terminal assembly 133 of the package gets further thermal relief by using an upper heat sink 152 associated with, in thermal contact or communication with, the high-side source terminal 133, such as coupled to the high-side source terminal 133 via dielectric layer 131 (e.g., dielectric thermal interface material). As illustrated in FIG. 5, a high performance dielectric thermal interface material (TIM) provides the necessary electrical insulation for the low-side source terminal assembly 133 and high-side source terminal assembly 133. TIM also provides high thermal conductivity for rapid heat transfer from source side of the semiconductor devices (10, 110) to lower heat sink 252 and the upper heat sink 152.

Figure 6:
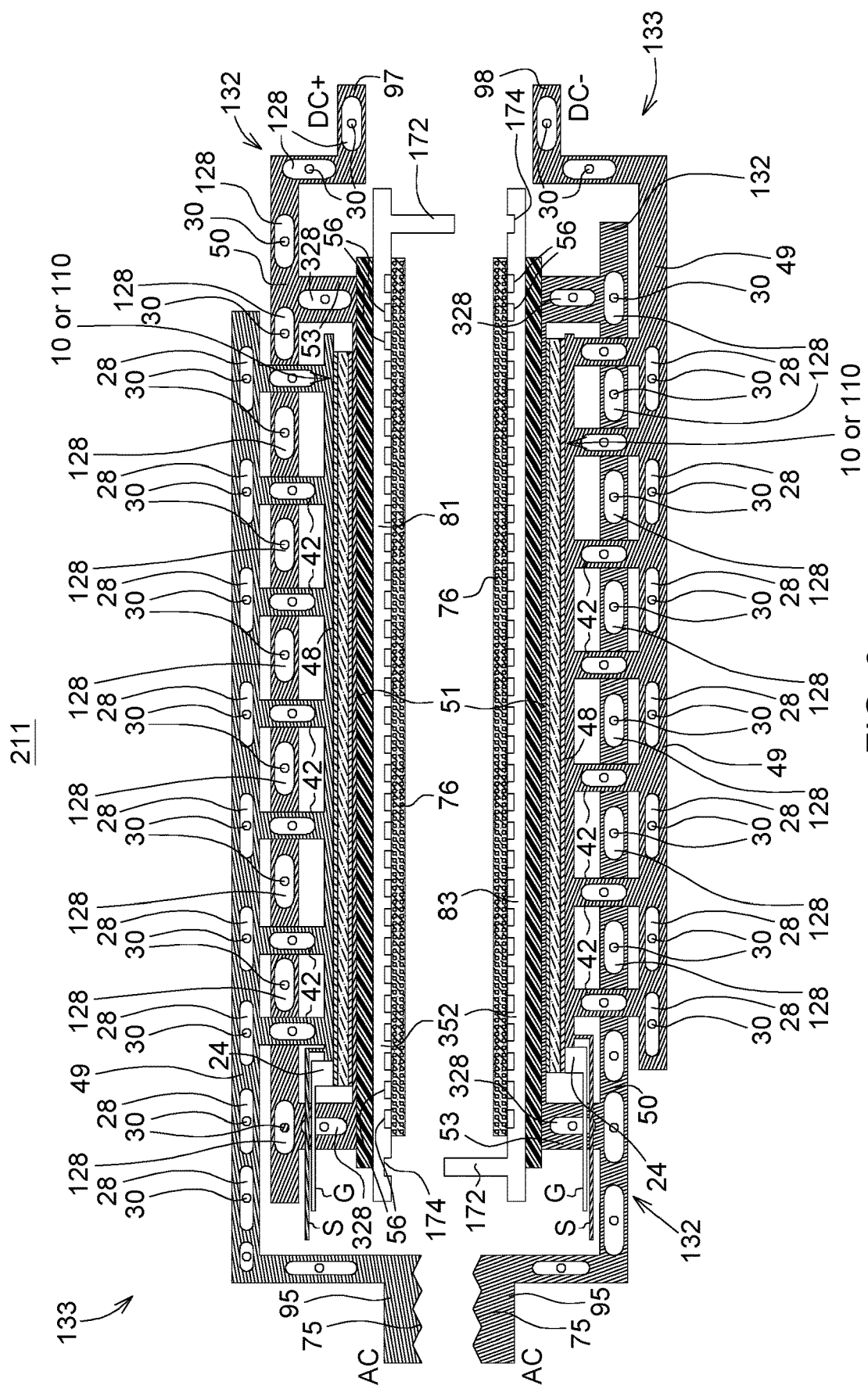
FIG. 6 is a cross-sectional view of an alternate embodiment of the semiconductor device module of FIG. 3, during assembly.
Figure 7:
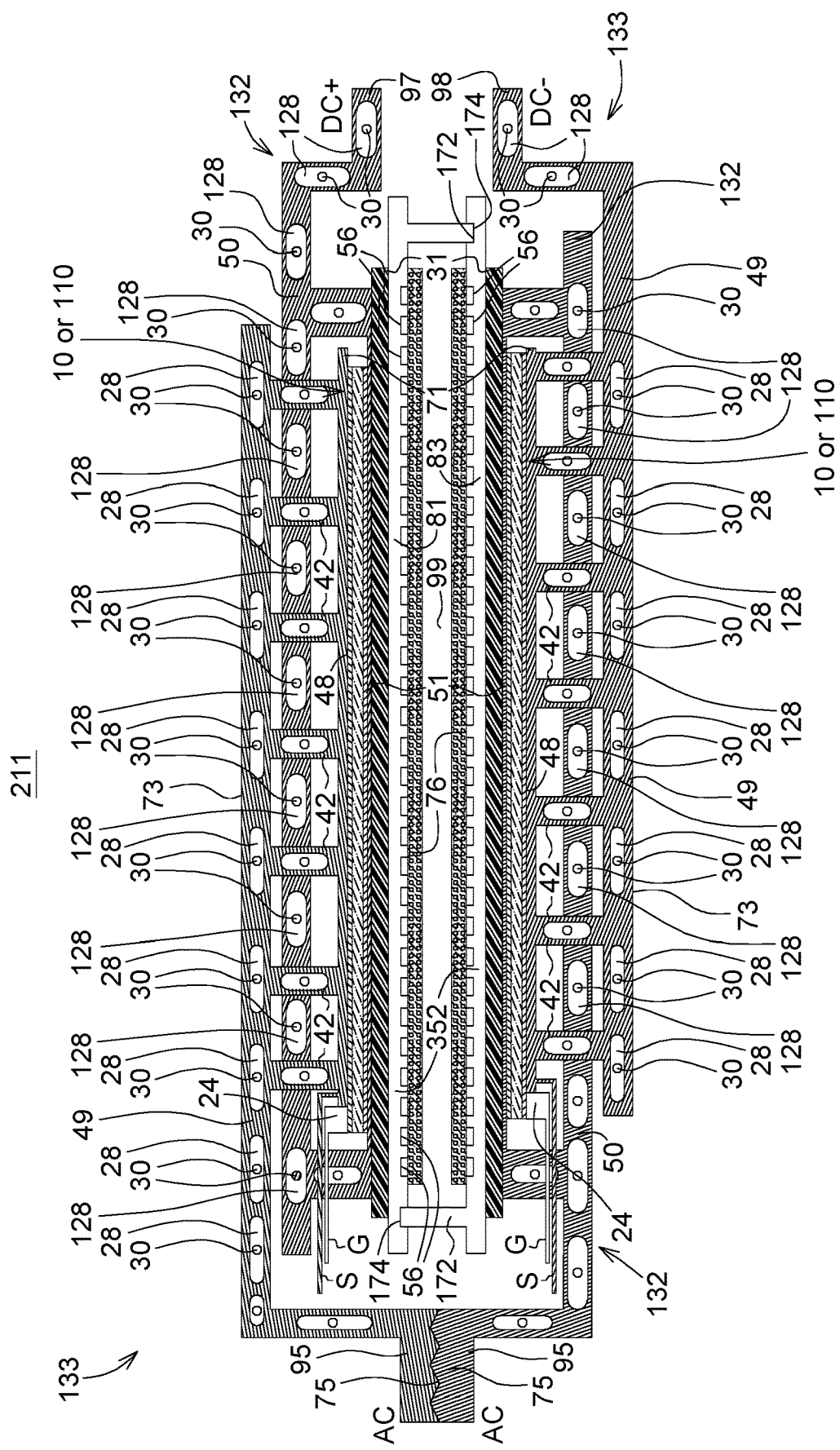
FIG. 7 is a cross-sectional view of the semiconductor device of FIG. 6, after assembly.

FIG. 6 is a cross-sectional view of an alternate embodiment of the semiconductor device 211 of FIG. 3, during assembly. The alternate embodiment of FIG. 6 is similar to the embodiment of FIG. 3, except that the alternate embodiment of FIG. 6 replaces the central heat sink 52 with an alternate central heat sink 352 or intermediate heat sink. In FIG. 6 and FIG. 7, the central heat sink 352 or intermediate heat sink further comprises a central chamber 99 (FIG. 7) defined by a first member 81 (lower member) and second member 83 (an upper member) with sides that engage each other or interlock with each other via walls 172 and slot 174, with or without optional sealant, elastomeric seal, or gasket.

The central chamber 99 is configured to hold, retain or contain one or more mini-channel cooling members 76 between the upper member 83 and the lower member 81, along with any coolant circulating within the mini-channel cooling member 76. The upper member 83 and the lower member 81 have channels or grooves that are adjacent to or in hydraulic communication with one or more mini-channel cooling members 76 and its corresponding mini-channels embedded, incorporated or realized in the interior of the mini-channel member 76 or on its exterior. For example, the mini-channels may have a cross-sectional area that is less than the cross-sectional area of the channels 56 within the first member 81 and the second member 83, where the mini-channels are generally parallel to each other and parallel to a longitudinal axis of the channels 56 that exit or enter the plane of the sheet in FIG. 8. Further, U.S. Pat. No. 9,564,385 is hereby incorporated by reference with respect to the mini-channel cooling member 76, the first member 81 and the second member 83.

In one embodiment, the mini-channel cooling member 76 comprises a manifold that directs coolant to targeted channels in the upper member 83 or lower member 81 based upon localized heat dissipation characteristics of the semiconductor device (10, 110) and is paired with a corresponding semiconductor device (10, 110). If multiple cooling members 76 are used, such as an upper cooling member and lower cooling member, the upper cooling member and the lower cooling member may be separated by a separator or divider.

To manage thermal-mechanical stresses in the semiconductor device (111 or 211) and its packaging, on the drain surface 66 of the semiconductor chip (10, 110) or die, the drain terminal assembly 132 can be bonded to the drain pad (59, 159, 22) or the drain metallization using compliant nano-wire material, which is advanced soldering material.

In one embodiment, the thermal interface material (TIM) for any dielectric layer (31, 131) comprises an advanced adhesive/bonding material with high thermal conductivity. For example, the TIM may comprise a film or electrical insulation layer to achieve target isolation (e.g., 5 Kilovolt/centimeter) between the drain terminal assembly 132 and the central heat sink 52, upper heat sink 152, or lower heat sink 252 (e.g., where any heat sink can be configured as a copper or copper-composite material base-plate with coolant channels 56).

Figure 8:
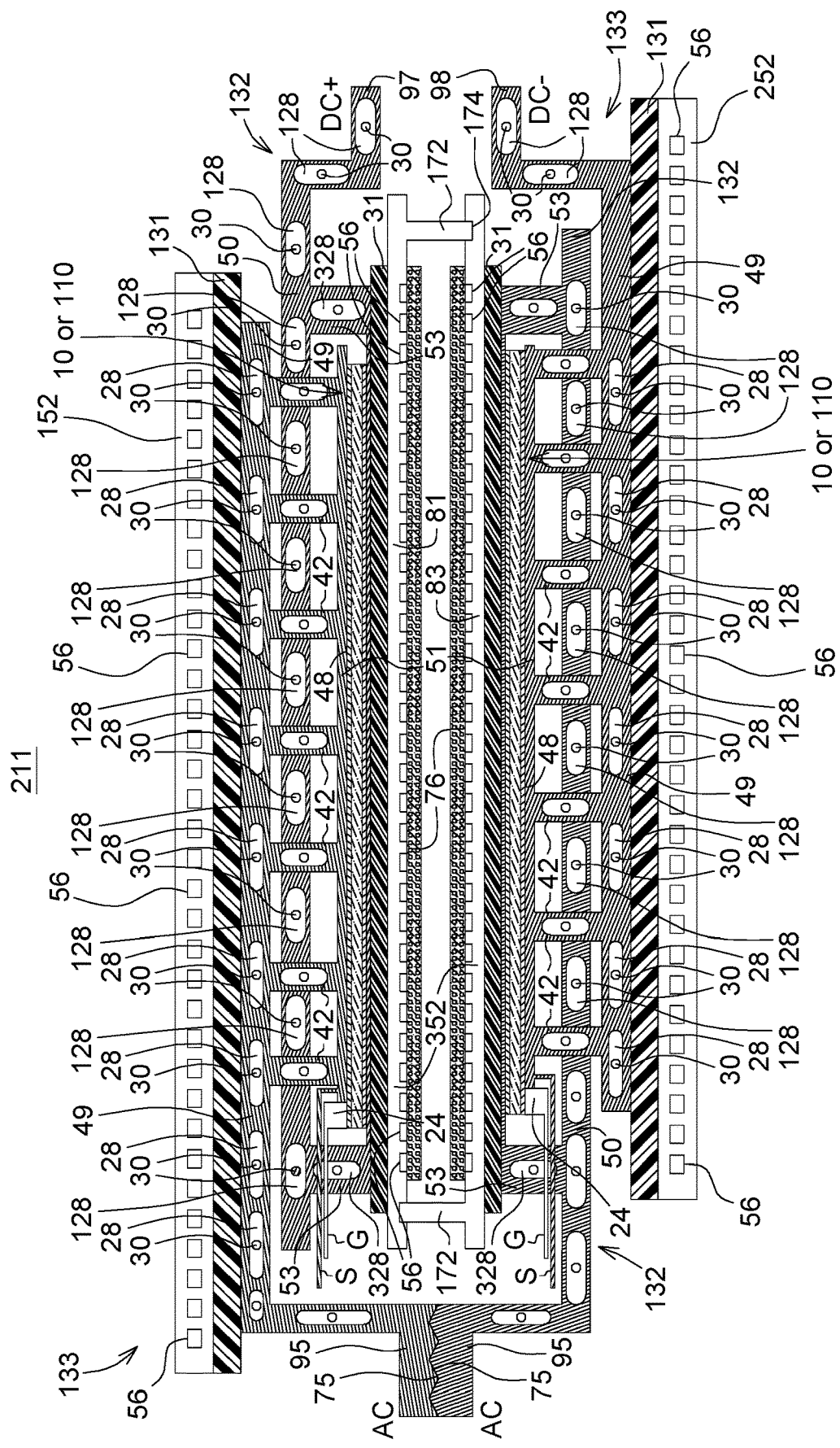
FIG. 8 is a cross-sectional view of the semiconductor device of FIG. 7 further comprising outer heat sinks.

The semiconductor device (111 or 211) or package radiates or provide a primary thermal dissipation path from the heat-generating semiconductor dies to the upper heat sink 152 and the lower heat sink 252 via the source terminal assemblies 133. Meanwhile, the semiconductor device (111 or 211) or package radiates or provides a secondary thermal dissipation path from the heat-generating semiconductor dies to the central heat sink 52 via the drain terminal assemblies 132. At the interface between the semiconductor chip 10 or dies and the terminal assemblies, a TIM, such as thin-film insulation sheet, provides high thermal conductivity at bond-line, while achieving desired insulation between high-voltage section of semiconductor chip 10 and central heat sink 52 (drain-side) and upper heat sink 152 (source-side) and lower heat sink 252 (source-side). The semiconductor device 11 and its package can facilitate thermal, electrical performance while enduring extreme vibrations and shocks experienced by the off-highway vehicles. In an alternate embodiment, the semiconductor device (111 or 211) as shown in FIGS. 5 and 8 will be further packaged in a ruggedized outer housing. The ruggedized outer housing will provide access for coolant ports, electrical power ports, and terminals for gate-drive signals.

FIG. 7 is a cross-sectional view of the semiconductor device 211 of FIG. 6, after assembly. Like reference numbers in FIG. 6 and FIG. 7 indicate like elements or like features.

FIG. 8 is a cross-sectional view of the semiconductor device 211 of FIG. 7 further comprising outer heat sinks. In FIG. 8, the semiconductor device 211 module further comprises an upper heat sink 152 above the first semiconductor chip 10, where the upper heat sink 152 in thermal communication with an upper section of the first source terminal 133. The upper heat sink 152 may be electrically isolated from the first source terminal assembly 133 or the source outer section 49 of the first source terminal assembly 133 by a dielectric layer 131 or dielectric thermal interface material layer.

In an alternate embodiment the upper heat sink 152 is composed of a dielectric material, such as ceramic, a polymer, a plastic, a composite, a fiber-filled polymer or a fiber-filled plastic.

In one example, the upper heat sink 152 comprises a base plate with channels 56 for holding or circulating a coolant. In the upper heat sink 152, or lower heat sink 252 channels 56 comprise a set of parallel channels 56 or circuitous channels 56 that are in hydraulic communication with an inlet port and an outlet port for coolant. Although the channels 56 of the upper heat sink 152 or lower heat sink 252 are illustrated as generally rectangular cross sections, the channels 56 may have generally elliptical, oval, circular or other cross-sectional shapes. The inlet port or the outlet port for the coolant may be connected to or in hydraulic communication with a radiator of an internal combustion engine. Further, the coolant may comprise an ethylene glycol-water mixture or another anti-freeze coolant.

Similarly, in FIG. 8, a lower heat sink 252 is disposed below the second semiconductor chip 110, where the lower heat sink 252 is in thermal communication with a source outer section 49 of the second source terminal assembly 133. For example, the lower heat sink 252 comprises a base plate with channels 56 for holding or circulating a coolant. The lower heat sink 252 may be electrically isolated from the second source terminal 133 or the source inner section 48 of the second source terminal assembly 133 by a dielectric layer 131 or dielectric thermal interface material layer.

In an alternate embodiment the lower heat sink 252 is composed of a dielectric material, such as ceramic, a polymer, a plastic, a composite, a fiber-filled polymer or a fiber-filled plastic.

The packaging of a semiconductor device 211 with phase-change material 30 for improved thermal performance is well-suited for use in inverter modules that are equal or greater than 50 Kilo-Watts and that are cooled by coolant, such as an ethylene-glycol water coolant that is circulated in an internal combustion engine cooling system, radiator or heat exchanger. The packaging reduces or minimizes thermal barriers between the semiconductor chip (10 or 110) or semiconductor die and the cooling channels 56 within one or more heat sinks that are cooled by a water ethylene glycol (WEG) based heat-exchange.

The source terminal assembly 133 and the drain terminal assembly 132 with its hollow compartments or pocket (28, 128, 228, 328) or chambers can reduce the typical inductance of conventionally packaged semiconductor power module to be less than approximately 10 nano-Henries (nH) across its direct current (DC) terminals. Accordingly, the packaging of the semiconductor device (11, 111 or 211) can support improved switching performance and switching speed of the power module, such as a switching speed beyond approximately 4 kV/µs. A higher potential switching speed of the power module can lead to lower energy loss during turn-off events of the semiconductor device (11, 111 or 211) for example.

In general, if switching semiconductor devices (11, 111 or 211) are used in inverters to control drive motors of off-road vehicles or heavy equipment, the switching tends to produce energy loss during turn-off events. Here, the packaging of the semiconductor device facilitates rapid heat removal from the heat generating area of the power semiconductor chips and facilitates reduction in excessive temperature difference between semiconductor die and other portions of the semiconductor packaging that could otherwise cause failures or reduced longevity of the semiconductor device 11 because of mismatched coefficient-of-thermal expansion (CTE) for different portions of the semiconductor device 11. For example, the semiconductor die typically operates at the highest temperature and coolant (aqueous mixture of ethylene glycol) in channels 56 of the one or more heat sinks operates at lowest temperature.

While the disclosure has been described in detail in the drawings and foregoing description, the description shall be considered as exemplary and illustrative, rather than restrictive of the scope of protection set forth in the claims. Various illustrative embodiments have been shown and described in this document, such that any changes, variants and modifications that come within the spirit of the disclosure will fall within the scope of the disclosure and its associated claims.

The following is claimed:

1. A semiconductor device comprising:
a generally planar semiconductor chip comprising a first side and second side opposite the first side, the first side associated with a source conductive pad, the second side associated with a drain conductive pad; a gate pad overlying a portion of the first side;
a source terminal comprising a metallic strip assembly with a series of pocket chambers spaced apart from each other and partially filled with a phase-change material filling;
a drain terminal spaced apart from the source terminal by a dielectric layer; and
the source terminal bonded to the source conductive pad via a bonding interface material.

2. The semiconductor device according to claim 1 wherein the drain terminal further comprises a metallic strip assembly with a series of pocket chambers spaced apart from each other and partially filled with a phase-change material filling.

3. The semiconductor device according to claim 2 wherein the series of pocket chambers of the drain terminal are substantially oval or substantially spherical and wherein the phase-change material filling comprises a refrigerant.

4. The semiconductor device according to claim 2 further comprising a heat sink in thermal communication with the drain terminal via a dielectric thermal interface material, wherein the heat sink comprises a base plate with channels for holding or circulating a coolant.

5. The semiconductor device according to claim 4 wherein the channels comprise a set of parallel channels with generally rectangular cross sections that in hydraulic communication with an inlet port and an outlet port for coolant.

6. The semiconductor device according to claim 1 wherein the series of pocket chambers of the source terminal are substantially oval or substantially spherical and wherein the phase-change material filling comprises a refrigerant.

7. The semiconductor device according to claim 1 wherein the semiconductor chip comprises a silicon-carbide, metal oxide semiconductor field effect transistor.

8. The semiconductor device according to claim 1 wherein the bonding interface material is composed of solder or the combination of solder and copper.

9. The semiconductor device according to claim 1 wherein the source terminal or metallic strip assembly comprises:
an inner source section;
an outer source section spaced apart from the inner source section and a parallel to the inner source section;
a plurality of conductive vertically-extending source stem sections that extend between an inner source section and an outer source section.

10. The semiconductor device according to claim 9 wherein the vertically-extending source sections pass through openings in the drain terminal and are electrically isolated from the drain terminal.

11. The semiconductor device according to claim 10 wherein each of the vertically-extending source stem sections comprise a metallic strip with one or more pocket chambers partially filled with a phase-change material filling.

12. The semiconductor device according to claim 1 wherein the drain terminal or metallic strip assembly comprises:
an inner drain section;
an outer drain section spaced apart from the inner drain section and a parallel to the inner drain section;
a plurality of conductive vertically-extending drain stem sections that extend between an inner drain section and an outer drain section.

13. The semiconductor device according to claim 12 wherein each of the conductive vertically-extending drain stem sections comprise a metallic strip with one or more pocket chambers partially filled with a phase-change material filling.

14. A semiconductor device comprising:
a generally planar first semiconductor chip comprising an outer side and an inner side opposite the outer side, the outer side associated with a first source conductive pad, the inner side associated with a first drain conductive pad; a first gate pad overlying a portion of the outer side;
a first source terminal comprising a metallic strip assembly with a series of pocket chambers spaced apart from each other and partially filled with a phase-change material filling;
a first drain terminal spaced apart from the first source terminal by a first dielectric layer;
the first source terminal bonded to the first source conductive pad via a bond interface material;
a generally planar second semiconductor chip comprising an upper side and a lower side opposite the upper side, the upper side associated with a second source conductive pad, the lower side associated with a second drain conductive pad; a second gate pad overlying a portion of the upper side;
a second source terminal comprising a metallic strip assembly with a series of pocket chambers spaced apart from each other and partially filled with a phase-change material filling;
a second drain terminal spaced apart from the second source terminal by a second dielectric layer; and
the second source terminal bonded to the second source conductive pad via a bond interface material.

15. The semiconductor device according to claim 14 wherein the first drain terminal further comprises a metallic strip assembly with a series of pocket chambers spaced apart from each other and partially filled with a phase-change material filling; the second drain terminal further comprises a metallic strip assembly with a series of pocket chambers spaced apart from each other and partially filled with a phase-change material filling.

16. The semiconductor device according to claim 14 further comprising an intermediate heat sink between the first semiconductor chip and the second semiconductor chip, the intermediate heat sink in thermal communication with the first drain terminal via a first dielectric thermal interface material, the intermediate heat sink in thermal communication with the second drain terminal via a second dielectric thermal interface materials, wherein the intermediate heat sink comprises a base plate with channels for holding or circulating a coolant.

17. The semiconductor device according to claim 14 further comprising an upper heat sink above the first semiconductor chip, the upper heat sink in thermal communication with an upper section of the first source terminal wherein the upper heat sink comprises a base plate with channels for holding or circulating a coolant.

18. The semiconductor device according to claim 14 further comprising a lower heat sink below the second semiconductor chip, the lower heat sink in thermal communication with a lower section of the second source terminal wherein the upper heat sink comprises a base plate with channels for holding or circulating a coolant.

* * * * *